United States Patent
Araki

(10) Patent No.: US 10,727,812 B2
(45) Date of Patent: Jul. 28, 2020

(54) MULTIPLEXER

(71) Applicant: Murata Manufacturing Co., Ltd., Nagaokakyo-shi, Kyoto-fu (JP)

(72) Inventor: Masato Araki, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 22 days.

(21) Appl. No.: 16/351,605

(22) Filed: Mar. 13, 2019

(65) Prior Publication Data

US 2019/0296716 A1 Sep. 26, 2019

(30) Foreign Application Priority Data

Mar. 26, 2018 (JP) .................. 2018-058117

(51) Int. Cl.
*H03H 9/70* (2006.01)
*H03H 9/54* (2006.01)
*H03H 9/13* (2006.01)
*H03H 9/00* (2006.01)

(52) U.S. Cl.
CPC .............. *H03H 9/706* (2013.01); *H03H 9/13* (2013.01); *H03H 9/54* (2013.01); *H03H 9/0014* (2013.01)

(58) Field of Classification Search
CPC ................................. H03H 9/54–76
See application file for complete search history.

(56) References Cited

U.S. PATENT DOCUMENTS

| 9,219,467 | B2 * | 12/2015 | Inoue .................. H03H 9/6433 |
| 9,722,573 | B2 * | 8/2017 | Fujiwara ................. H04B 1/40 |
| 10,135,422 | B2 * | 11/2018 | Goto ..................... H03H 9/725 |
| 2013/0113576 | A1 | 5/2013 | Inoue et al. |

FOREIGN PATENT DOCUMENTS

JP 2013-118611 A 6/2013

* cited by examiner

*Primary Examiner* — Dean O Takaoka
*Assistant Examiner* — Alan Wong
(74) *Attorney, Agent, or Firm* — Keating & Bennett, LLP

(57) ABSTRACT

A multiplexer includes a first filter connected to a common terminal and a first input/output terminal, a second filter connected to the common terminal and a second input/output terminal, a first cancel circuit including a first terminal, a second terminal acoustically connected to the first terminal, and a third terminal acoustically connected to the first terminal, and a second cancel circuit including a fourth terminal, and a fifth terminal acoustically connected to the fourth terminal. The first terminal is connected to the first input/output terminal. The second terminal is connected to the second input/output terminal. The fourth terminal is connected to the third terminal. The fifth terminal is connected to the second input/output terminal. The first and second cancel circuits generate signals that cancel out unnecessary signals in a prescribed frequency band propagating between the first and second input/output terminals.

10 Claims, 3 Drawing Sheets

MULTIPLEXER

CROSS REFERENCE TO RELATED APPLICATIONS

This application claims the benefit of priority to Japanese Patent Application No. 2018-058117 filed on Mar. 26, 2018. The entire contents of this application are hereby incorporated herein by reference.

BACKGROUND OF THE INVENTION

1. Field of the Invention

The present invention relates to a multiplexer including a filter circuit.

2. Description of the Related Art

In order to handle a trend toward multiple bands, recent cellular phones are provided with multiplexers, which are disposed immediately below the antennas and include multiple filters corresponding to different pass bands.

Japanese Unexamined Patent Application Publication No. 2013-118611 discloses a cancel circuit configuration in which the circuit is disposed between the input terminal of a transmission filter and the output terminal of a reception filter defining a multiplexer, with the circuit generating a signal component having a phase inverse with respect to an unnecessary signal flowing in the multiplexer. Unnecessary signals flowing in the multiplexer are able to be suppressed as a result, which makes it possible to provide a multiplexer with improved isolation.

However, in the multiplexer disclosed in Japanese Unexamined Patent Application Publication No. 2013-118611, the input terminal of the cancel circuit defined by a single-stage longitudinally-coupled elastic wave resonator is connected to the input terminal of the transmission filter via a capacitance element, and the output terminal of the cancel circuit is connected to the output terminal of the reception filter via a capacitance element. Accordingly, between the input terminal of the transmission filter and the output terminal of the reception filter, the cancel circuit generates only one type of signal, having a prescribed band width, as the signal for suppressing unnecessary signals flowing in the multiplexer. In other words, it is difficult for a small-sized cancel circuit, such as a single-stage longitudinally-coupled elastic wave resonator, to suppress multiple unnecessary signals, such as unnecessary signals in two or more discrete frequency ranges or multiple unnecessary signals having different signal strengths.

SUMMARY OF THE INVENTION

Preferred embodiments of the present invention provide multiplexers each including a small-sized cancel circuit that reduces or prevents multiple unnecessary signals arising between a plurality of filter circuits defining the multiplexer.

A multiplexer according to a preferred embodiment of the present invention includes a common terminal, a first input/output terminal, and a second input/output terminal into and from which a high-frequency signal is input/output; a first filter circuit that has a first frequency band as a pass band and that is connected between the common terminal and the first input/output terminal; a second filter circuit that has a second frequency band, which is different from the first frequency band, as a pass band, and that is connected between the common terminal and the second input/output terminal; a first cancel circuit including a first elastic wave resonator, a first terminal, a second terminal acoustically connected to the first terminal via the first elastic wave resonator, and a third terminal acoustically connected to the first terminal via the first elastic wave resonator; and a second cancel circuit including a second elastic wave resonator, a fourth terminal, and a fifth terminal acoustically connected to the fourth terminal via the second elastic wave resonator. The first terminal is connected to the first input/output terminal, the second terminal is connected to the second input/output terminal without going through the second cancel circuit, the fourth terminal is connected to the third terminal without being acoustically connected to the first cancel circuit and the second cancel circuit, and the fifth terminal is connected to the second input/output terminal. The first cancel circuit and the second cancel circuit generate signals that cancel out an unnecessary signal in a prescribed frequency band propagating between the first input/output terminal and the second input/output terminal.

In the multiplexer, a signal flowing in a path defined by the first input/output terminal, the first filter circuit, the common terminal, the second filter circuit, and the second input/output terminal, a signal propagating directly between the first input/output terminal and the second input/output terminal (a direct wave), and other signals, which are multiple unnecessary signals flowing between the first input/output terminal and the second input/output terminal, are able to be produced.

However, according to the above-described configuration, with the first cancel circuit, in which the first terminal is acoustically connected to the second terminal and the third terminal, adjusting electrode parameters and other suitable parameters of the first elastic wave resonator makes it possible to flexibly set the phases and amplitudes of signals between the first terminal and the second and third terminals. Additionally, with the second cancel circuit, in which the fourth terminal and the fifth terminal are acoustically connected, adjusting electrode parameters and other suitable parameters of the second elastic wave resonator makes it possible to even more flexibly set the phases and amplitudes of signals output from the third terminal of the first cancel circuit.

Accordingly, multiple unnecessary signals flowing between the first input/output terminal and the second input/output terminal are able to be reduced or prevented by two circuit configurations, namely the first cancel circuit, and a circuit in which the first cancel circuit and the second cancel circuit are connected in series. Furthermore, the above-described two circuit configurations, which generate signals that reduce or prevent multiple unnecessary signals, share the first cancel circuit, and thus, the multiplexer is able to be provided with a small-sized cancel circuit that reduces or prevents multiple unnecessary signals arising among the plurality of filter circuits.

The first elastic wave resonator may be a longitudinally-coupled resonator including a substrate having piezoelectric properties and a plurality of IDT (InterDigitated Transducer) electrodes provided on the substrate; of the plurality of IDT electrodes, a first IDT electrode and a second IDT electrode may be acoustically connected, the first IDT electrode and a third IDT electrode may be acoustically connected, the first IDT electrode may be connected to the first terminal, the second IDT electrode may be connected to the second terminal, and the third IDT electrode may be connected to the third terminal; and a resonant frequency defined by the second IDT electrode may be different from a resonant frequency defined by the third IDT electrode.

Accordingly, the second IDT electrode and the third IDT electrode of the longitudinally-coupled resonator have different resonant frequencies, and thus, the phase and amplitude of an output signal from the first cancel circuit to reduce or prevent the above-described multiple unnecessary signals are different from the phase and amplitude of an output signal from the series circuit defined by the first cancel circuit and the second cancel circuit. As such, multiple unnecessary signals flowing between the first input/output terminal and the second input/output terminal are able to be effectively reduced or prevented by a small-sized cancel circuit defined by the first cancel circuit and the second cancel circuit.

Additionally, an electrode finger pitch of the second IDT electrode may be different from an electrode finger pitch of the third IDT electrode.

Accordingly, the second IDT electrode and the third IDT electrode of the longitudinally-coupled resonator have different electrode finger pitches, and thus, the phase and amplitude of an output signal from the first cancel circuit to reduce or prevent the above-described multiple unnecessary signals are different from the phase and amplitude of an output signal from the series circuit defined by the first cancel circuit and the second cancel circuit. As such, multiple unnecessary signals flowing between the first input/output terminal and the second input/output terminal are able to be effectively reduced or prevented by a small-sized cancel circuit defined by the first cancel circuit and the second cancel circuit.

Additionally, an electrode finger duty ratio of the second IDT electrode may be different from an electrode finger duty ratio of the third IDT electrode.

Accordingly, the second IDT electrode and the third IDT electrode of the longitudinally-coupled resonator have different electrode finger duty ratios, and thus, the phase and amplitude of an output signal from the first cancel circuit to reduce or prevent the above-described multiple unnecessary signals are different from the phase and amplitude of an output signal from the series circuit defined by the first cancel circuit and the second cancel circuit. As such, multiple unnecessary signals flowing between the first input/output terminal and the second input/output terminal are able to be effectively reduced or prevented by a small-sized cancel circuit defined by the first cancel circuit and the second cancel circuit.

Additionally, the second elastic wave resonator may be a longitudinally-coupled resonator including the substrate and a plurality of IDT electrodes provided on the substrate; and of the plurality of IDT electrodes, a fourth IDT electrode and a fifth IDT electrode may be acoustically connected, the fourth IDT electrode may be connected to the fourth terminal, and the fifth IDT electrode may be connected to the fifth terminal.

Accordingly, the first cancel circuit and the second cancel circuit preferably are longitudinally-coupled resonators provided on the same substrate having piezoelectric properties, and thus the cancel circuit is able to be made smaller.

Additionally, the first filter circuit may be a transmission-side filter that propagates a high-frequency signal from the first terminal to the common terminal; the second filter circuit may be a reception-side filter that propagates a high-frequency signal from the common terminal to the second terminal; the prescribed frequency band may be included in at least one of the first frequency band and the second frequency band, and the signals generated by the first cancel circuit and the second cancel circuit may have different phases from the unnecessary signal; and the frequency at which the first elastic wave resonator has a minimum insertion loss may be located in at least one of the first frequency band and the second frequency band.

This improves the attenuation characteristics of the first filter circuit or the second filter circuit, which improves the isolation characteristics of the first filter circuit and the second filter circuit.

Additionally, each of the first filter circuit and the second filter circuit may be a ladder elastic wave filter circuit including a plurality of elastic wave resonators.

In a case in which the first filter circuit and the second filter circuit are ladder elastic wave filter circuits, the phase will not vary in a complex manner in the attenuation bands of the first filter circuit and the second filter circuit. Accordingly, components having an inverse phase with respect to components flowing in the first filter circuit and the second filter circuit are able to easily be defined by the cancel circuits, which are defined by longitudinally-coupled resonators, for example. As such, the isolation characteristics of the first filter circuit and the second filter circuit is even more effectively improved.

Additionally, the second cancel circuit may further include a sixth terminal acoustically connected to the fourth terminal via the second elastic wave resonator; the multiplexer may further include a third cancel circuit including a third elastic wave resonator, a seventh terminal, and an eighth terminal acoustically connected to the seventh terminal via the third elastic wave resonator; and the sixth terminal may be connected to the seventh terminal without being acoustically connected to the second cancel circuit and the third cancel circuit, and the eighth terminal may be connected to the second input/output terminal.

Accordingly, multiple unnecessary signals flowing between the first input/output terminal and the second input/output terminal are able to be reduced or prevented by three circuit configurations, namely the first cancel circuit, a circuit in which the first cancel circuit and the second cancel circuit are connected in series, and a circuit in which the first cancel circuit, the second cancel circuit, and the third cancel circuit are connected in series. Furthermore, the above-described three circuit configurations, which generate signals to reduce or prevent multiple unnecessary signals, share the first cancel circuit and the second cancel circuit, and thus the multiplexer is able to be provided with a small-sized cancel circuit that reduces or prevents multiple unnecessary signals arising among the plurality of filter circuits.

Additionally, the multiplexer may further include a fourth cancel circuit including a fourth elastic wave resonator, a ninth terminal, and a tenth terminal acoustically connected to the ninth terminal via the fourth elastic wave resonator; and the ninth terminal may be connected to the third terminal without being acoustically connected to the first cancel circuit and the fourth cancel circuit, and the tenth terminal may be connected to the second input/output terminal.

Accordingly, multiple unnecessary signals flowing between the first input/output terminal and the second input/output terminal are able to be reduced or prevented by three circuit configurations, namely the first cancel circuit, a circuit in which the first cancel circuit and the second cancel circuit are connected in series, and a circuit in which the first cancel circuit and the fourth cancel circuit are connected in series. Furthermore, the above-described three circuit configurations, which generate signals to reduce or prevent multiple unnecessary signals, share the first cancel circuit, and thus the multiplexer is able to be provided with a small-sized cancel circuit that reduces or prevents multiple unnecessary signals arising among the plurality of filter circuits.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
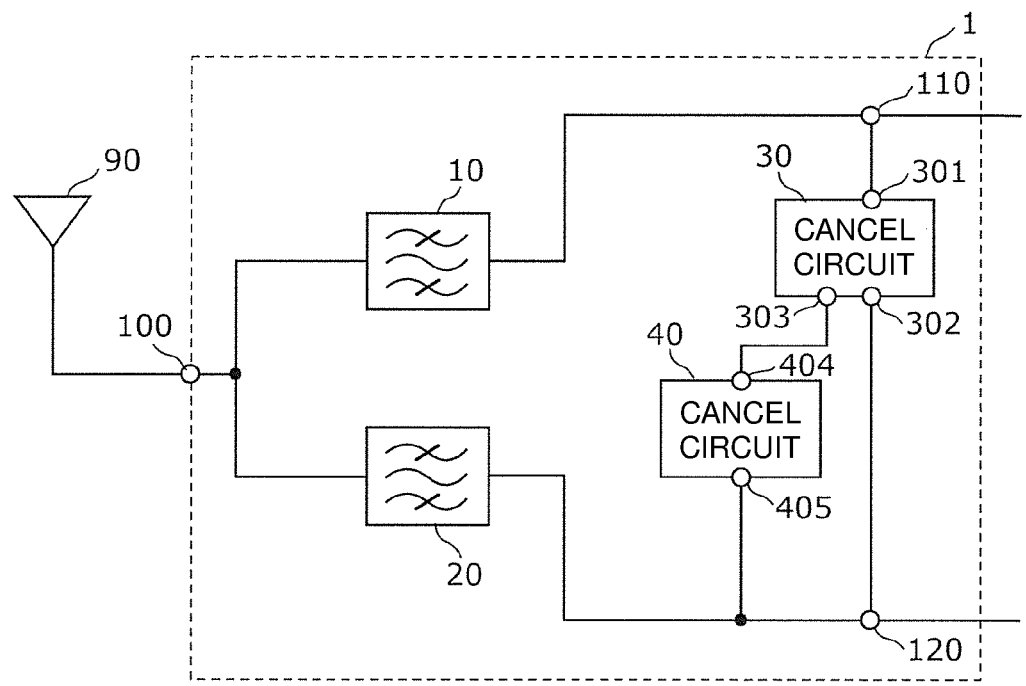
FIG. 1 is a circuit configuration diagram illustrating a multiplexer and peripheral circuitry thereof, according to a preferred embodiment of the present invention.

Hereinafter, preferred embodiments of the present invention will be described in detail with reference to examples and the accompanying drawings. Note that the preferred embodiments described hereinafter provide comprehensive or specific examples. The numerical values, shapes, materials, elements, arrangements of elements, connection structures, and other elements and features described in the following preferred embodiments are merely examples, and are not intended to limit the scope of the present invention. Of the elements described in the following preferred embodiments, elements not recited in the independent claims are described as optional elements. Furthermore, the sizes or size ratios of the elements illustrated in the drawings are not necessarily exact.

FIG. 1 is a circuit configuration diagram illustrating a multiplexer 1 and peripheral circuitry thereof, according to a preferred embodiment of the present invention. FIG. 1 illustrates the multiplexer 1 and an antenna element 90 according to the present preferred embodiment.

The multiplexer 1 includes filters 10 and 20, cancel circuits 30 and 40, a common terminal 100, an input/output terminal 110 (a first input/output terminal), and an input/output terminal 120 (a second input/output terminal). The filter 10 and the filter 20 are connected in common to the common terminal 100.

The filter 10 is a transmission filter that has a first frequency band as its pass band, and is a first filter circuit connected between the common terminal 100 and the input/output terminal 110.

The filter 20 is a reception filter that has a second frequency band, which is different from the first frequency band, as its pass band, and is a second filter circuit connected between the common terminal 100 and the input/output terminal 120.

According to this configuration, the multiplexer 1 defines and functions as a duplexer that outputs a high-frequency signal, which has been received by the antenna element 90, from the input/output terminal 120 through the common terminal 100 and the filter 20, and outputs a high-frequency signal, which has been input from the input/output terminal 110, to the antenna element 90 through the filter 10 and the common terminal 100.

Note that an amplifier circuit which amplifies the high-frequency signal, a high-frequency signal processing circuit (RFIC), or other suitable component, are connected to the input/output terminals 110 and 120. The common terminal 100 need not be connected to the antenna element 90, and may be connected to the antenna element 90 via a switching circuit or other suitable circuit. An inductor, a capacitor, or other suitable component to provide impedance matching may be inserted between the common terminal 100 and the filters 10 and 20, and between the antenna element 90 and the common terminal 100.

Although the frequency level relationship between the first frequency band and the second frequency band may have either band being the higher band and either band being the lower band, the present preferred embodiment describes an example of a circuit configuration in which the second frequency band is higher than the first frequency band, i.e., the pass band of the filter 20 is higher than the pass band of the filter 10.

The cancel circuit 30 is a first cancel circuit, and includes a terminal 301 (a first terminal), a terminal 302 (a second terminal), a terminal 303 (a third terminal), and a first elastic wave resonator. The terminal 301 and the terminal 302 are acoustically connected via the first elastic wave resonator. Additionally, the terminal 301 and the terminal 303 are acoustically connected via the first elastic wave resonator.

The cancel circuit 40 is a second cancel circuit, and includes a terminal 404 (a fourth terminal), a terminal 405 (a fifth terminal), and a second elastic wave resonator. The terminal 404 and the terminal 405 are acoustically connected via the second elastic wave resonator.

The cancel circuit 30 and the cancel circuit 40 are not acoustically connected. The terminal 301 is connected to the input/output terminal 110, and the terminal 302 is connected to the input/output terminal 120 without going through the cancel circuit 40. Additionally, the terminal 404 is connected to the terminal 303, and the terminal 405 is connected to the input/output terminal 120.

Note that circuit elements, such as an elastic wave resonator, an inductor, a capacitor, or a switch, for example, may be disposed between the terminal 301 and the input/output terminal 110. Additionally, circuit elements, such as an elastic wave resonator, an inductor, a capacitor, or a switch, for example, may be disposed between the terminal 302 and the input/output terminal 120, and between the terminal 405 and the input/output terminal 120.

In the multiplexer 1 having the above-described configuration, a signal flowing in a path defined by the input/output terminal 110, the filter 10, the common terminal 100, the filter 20, and the input/output terminal 120, a signal propagating directly between the input/output terminal 110 and the input/output terminal 120 (a direct wave), and other signals, which are multiple unnecessary signals flowing between the input/output terminal 110 and the input/output terminal 120, are able to be produced. As the strength of the unnecessary signals increases, the isolation performance of the multiplexer 1 decreases, which causes a drop in the quality of transmission signals and reception signals.

However, with the cancel circuit 30, in which the terminal 301 and the terminals 302 and 303 are acoustically connected, adjusting electrode parameters and other suitable parameters of the first elastic wave resonator makes it possible to flexibly set the phases and amplitudes of signals between the terminal 301 and the terminals 302 and 303. Additionally, with the cancel circuit 40, in which the terminal 404 and the terminal 405 are acoustically connected, adjusting electrode parameters and other suitable parameters of the second elastic wave resonator makes it possible to even more flexibly set the phases and amplitudes of signals output from the terminal 303 of the cancel circuit 30.

As a result, the cancel circuit 30 and the cancel circuit 40 are able to generate two or more types of signals that cancel out multiple unnecessary signals propagating between the input/output terminal 110 and the input/output terminal 120. In other words, multiple unnecessary signals flowing between the input/output terminal 110 and the input/output terminal 120 are able to be reduced or prevented by two circuit configurations, namely the cancel circuit 30, and a circuit in which the cancel circuit 30 and the cancel circuit 40 are connected in series. Furthermore, the above-described two circuit configurations share the cancel circuit 30, and thus, the multiplexer 1 is able to be provided with a small-sized cancel circuit that reduces or prevents the multiple unnecessary signals.

Figure 2:
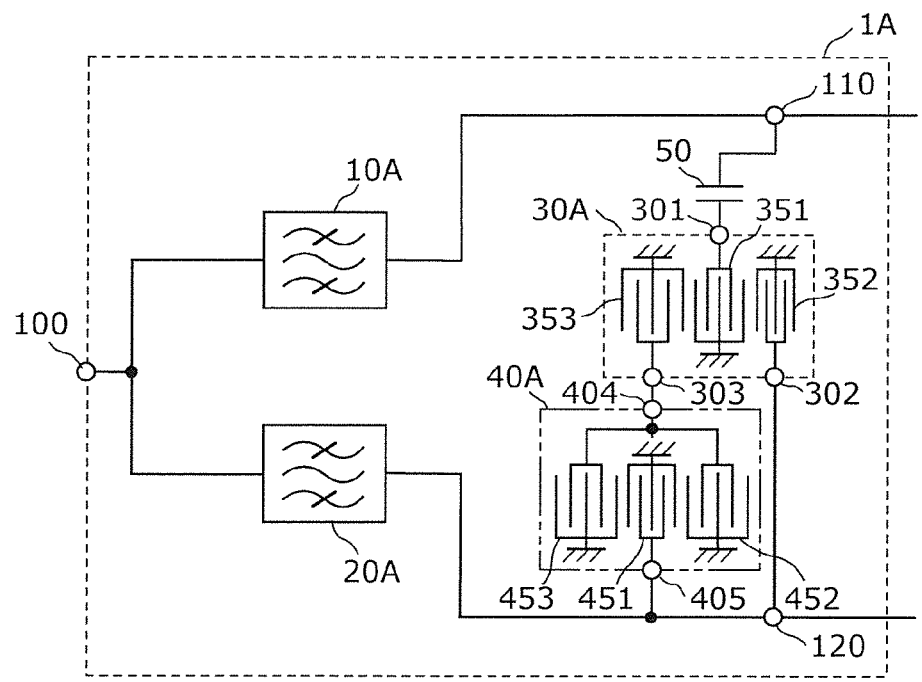
FIG. 2 is a circuit configuration diagram illustrating a multiplexer according to an Example 1 of a preferred embodiment of the present invention.

FIG. 2 is a circuit configuration diagram illustrating a multiplexer 1A according to an Example 1 of a preferred embodiment of the present invention. The multiplexer 1A illustrated in FIG. 2 is an example of a specific circuit configuration of the multiplexer 1 according to a preferred embodiment of the present invention. The multiplexer 1A includes filters 10A and 20A, a cancel circuit 30A, a cancel circuit 40A, a capacitance element 50, the common terminal 100, the input/output terminal 110 (the first input/output terminal), and the input/output terminal 120 (the second input/output terminal). The filter 10A and the filter 20A are connected in common to the common terminal 100.

The filter 10A is a transmission filter that has the first frequency band as its pass band, and is preferably, for example, a ladder elastic wave filter circuit that uses elastic waves and includes one or more serial arm resonators and one or more parallel arm resonators.

The filter 20A is a reception filter that has the second frequency band, which is different from the first frequency band, as its pass band, and is preferably, for example, a ladder elastic wave filter circuit that uses elastic waves and includes one or more serial arm resonators and one or more parallel arm resonators.

Note that the filters 10A and 20A may preferably include longitudinally-coupled resonators, for example, in addition to the serial arm resonators and the parallel arm resonators defining the ladder configuration.

The cancel circuit 30A is a first cancel circuit, and includes the terminals 301, 302, and 303, and a first longitudinally-coupled resonator. The first longitudinally-coupled resonator is a first elastic wave resonator including a substrate having piezoelectric properties, an IDT (InterDigitated Transducer) electrode 351 (a first IDT electrode), an IDT electrode 352 (a second IDT electrode), and an IDT electrode 353 (a third IDT electrode) provided on the stated substrate. Each of the IDT electrodes 351, 352, and 353 includes a pair of comb-shaped electrodes. Each of the comb-shaped electrodes includes a plurality of electrode fingers parallel or substantially parallel to each other and a busbar electrode connecting one end of each of the electrode fingers to each other, and the pair of comb-shaped electrodes provided by interleaving the electrode fingers of the two comb-shaped electrodes. Here, the pitch at which the comb-shaped electrodes are repeated is defined as an "electrode finger pitch". The ratio of a line width to a value obtained by adding the line width and a space width (the interval between adjacent electrode fingers), of the plurality of electrode fingers, is defined as an "electrode finger duty ratio".

The IDT electrode 351 and the IDT electrode 352 are adjacent to each other with respect to the arrangement direction of the plurality of electrode fingers (a direction intersecting with the direction in which the electrode fingers extend), and the IDT electrode 351 and the IDT electrode 353 are adjacent to each other with respect to the above-described arrangement direction. In other words, the IDT electrode 351 and the IDT electrode 352 are acoustically connected, and the IDT electrode 351 and the IDT electrode 353 are acoustically connected. Although not shown, a reflector may be provided on the outer side in the arrangement direction of the IDT electrodes 352 and 353. The IDT electrode 351 is connected to the terminal 301, the IDT electrode 352 is connected to the terminal 302, and the IDT electrode 353 is connected to the terminal 303.

Here, a resonant frequency defined by the substrate and the IDT electrode 352 is different from a resonant frequency defined by the substrate and the IDT electrode 353.

As a result, the phase and amplitude of an output signal from the terminal 302 of the cancel circuit 30A is different from the phase and amplitude of an output signal from the series circuit of the cancel circuits 30A and 40A (the terminal 405). Accordingly, multiple unnecessary signals flowing between the input/output terminal 110 and the input/output terminal 120 are able to be effectively reduced or prevented by a small-sized cancel circuit including the cancel circuits 30A and 40A.

As a non-limiting example of a method for making the resonant frequency defined by the IDT electrode 352 different from the resonant frequency defined by the IDT electrode 353, the electrode finger pitch of the IDT electrode 352 may preferably be different from the electrode finger pitch of the IDT electrode 353.

As another non-limiting example of a method for making the resonant frequency defined by the IDT electrode 352 different from the resonant frequency defined by the IDT electrode 353, the electrode finger duty ratio of the IDT electrode 352 may preferably be different from the electrode finger duty ratio of the IDT electrode 353.

The first longitudinally-coupled resonator of the cancel circuit 30A is not limited to including the three IDT electrodes 351, 352, and 353. A configuration including four or more IDT electrodes, such as a configuration including five IDT electrodes or a configuration including seven IDT electrodes, may be provided as well.

The cancel circuit 40A is a second cancel circuit, and includes the terminals 404 and 405, and a second longitudinally-coupled resonator. The second longitudinally-coupled resonator is a second elastic wave resonator including a substrate having piezoelectric properties, an IDT electrode 451 (a fifth IDT electrode), an IDT electrode 452 (a fourth IDT electrode), and an IDT electrode 453 (a fourth IDT electrode) provided on the substrate. Each of the IDT electrodes 451, 452, and 453 includes a pair of comb-shaped electrodes. Each of the comb-shaped electrodes includes a plurality of electrode fingers parallel or substantially parallel to each other and a busbar electrode connecting one end of each of the electrode fingers to each other, and the pair of comb-shaped electrodes are provided by interleaving the electrode fingers of the two comb-shaped electrodes. It is preferable that the substrate having piezoelectric properties of the second longitudinally-coupled resonator is the same as the substrate having piezoelectric properties of the first longitudinally-coupled resonator.

The IDT electrode 451 and the IDT electrode 452 are adjacent to each other with respect to the arrangement direction of the plurality of electrode fingers (a direction intersecting with the direction in which the electrode fingers extend), and the IDT electrode 451 and the IDT electrode 453 are adjacent to each other with respect to the arrangement direction. In other words, the IDT electrode 451 and the IDT electrode 452 are acoustically connected, and the IDT electrode 451 and the IDT electrode 453 are acoustically connected. Although not shown, a reflector may be provided on the outer side in the arrangement direction of the IDT electrodes 452 and 453. The IDT electrodes 452 and 453 are connected to the terminal 404, and the IDT electrode 451 is connected to the terminal 405.

The second longitudinally-coupled resonator of the cancel circuit 40A is not limited to including the three IDT electrodes 451, 452, and 453. Any configuration including two or more IDT electrodes, such as a configuration including two IDT electrodes or a configuration including four IDT electrodes, may be provided.

The cancel circuit 30A and the cancel circuit 40A are preferably defined by longitudinally-coupled resonators that are able to be provided on the same substrate having piezoelectric properties, and thus the cancel circuit is able to be made smaller.

In the multiplexer 1A according to the present example, if the filters 10 and 20 are ladder elastic wave filter circuits, the phase will not vary in a complex manner in the attenuation bands of the filters 10 and 20. Accordingly, signals having an inverse phase with respect to the unnecessary signals flowing in the filter 10 and the filter 20 are able to easily be provided by the cancel circuits 30A and 40A, which are defined by longitudinally-coupled resonators. As such, the advantageous effects of improving the isolation characteristics of the filter 10 and the filter 20 is even more pronounced.

In the multiplexer 1A according to the present example, the capacitance element 50 is connected between the transmission-side input/output terminal 110 and the cancel circuit 30A. Accordingly, the impedance when viewing the cancel circuit 30A from the input/output terminal 110 is able to be adjusted. The multiplexer 1A according to the present example handles the above-described impedance as an impedance in the pass band of the filter 10 (the first frequency band), for example. In other words, the impedance in the first frequency band, when viewing the cancel circuit 30A from the input/output terminal 110 side, is able to be adjusted. This makes it possible to reduce or prevent situations in which a signal in the first frequency band, input from the input/output terminal 110, does not travel toward the filter 10 and, instead, leaks to the cancel circuit 30A.

Note that the frequency at which the cancel circuit 30A has a minimum insertion loss may be located in at least one of the first frequency band and the second frequency band. This improves the attenuation characteristics of the filter 10 or 20, which improves the isolation characteristics of the filter 10 and the filter 20.

The capacitance element 50 may not be provided.

Figure 3:
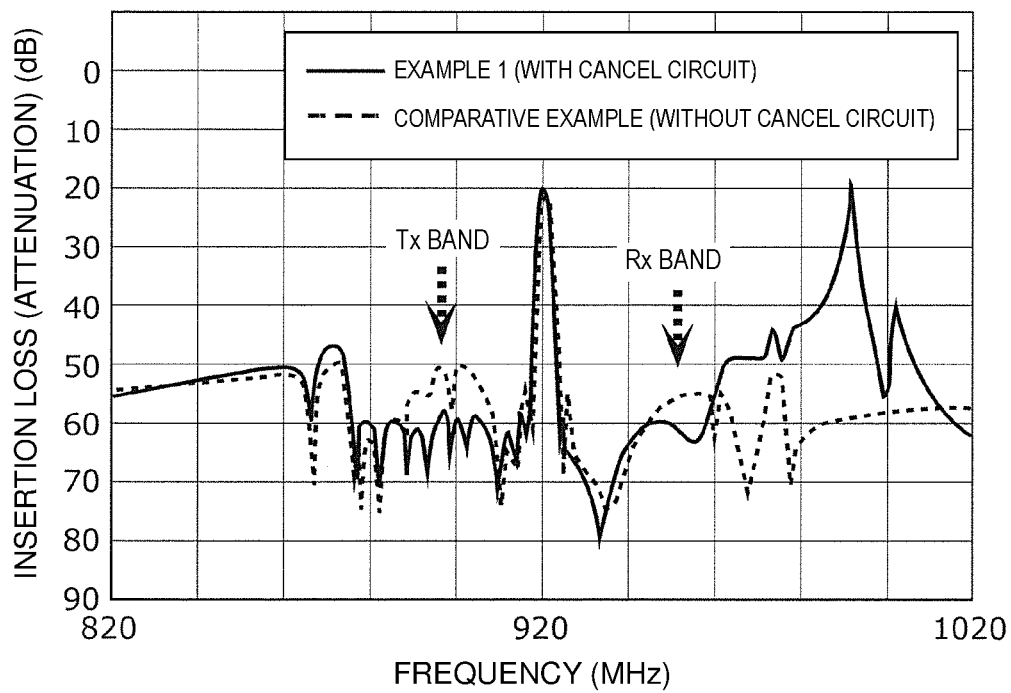
FIG. 3 is a graph comparing isolation characteristics of multiplexers according to the Example 1 and a Comparative Example.

FIG. 3 is a graph comparing the isolation characteristics of multiplexers according to the Example 1 and a Comparative Example. FIG. 3 illustrates the isolation characteristics (insertion loss) between the input/output terminals 110 and 120 of the multiplexer 1A according to the Example 1, and the isolation characteristics (insertion loss) between the input/output terminals 110 and 120 of a multiplexer according to the Comparative Example.

The multiplexer according to the Comparative Example is a multiplexer corresponding to the multiplexer 1A of the Example 1 with neither the cancel circuits 30A and 40A nor the capacitance element 50 provided.

Table 1 shows the electrode parameters of the cancel circuits 30A and 40A in the multiplexer 1A according to the Example 1.

TABLE 1

| | | MULTIPLEXER 1A (EXAMPLE 1) | |
|---|---|---|---|
| CANCEL CIRCUIT 30A | IDT ELECTRODE 351 | ELECTRODE FINGER PITCH (μm) | 2.78446-3.43220 |
| | | ELECTRODE FINGER DUTY RATIO | 0.5 |
| | | INTERSECTING WIDTH (μm) | 7.68345 |
| | IDT ELECTRODE 352 | ELECTRODE FINGER PITCH (μm) | 3.18644-3.45139 |
| | | ELECTRODE FINGER DUTY RATIO | 0.5 |
| | | INTERSECTING WIDTH (μm) | 7.68345 |
| | IDT ELECTRODE 353 | ELECTRODE FINGER PITCH (μm) | 2.84415-3.14956 |
| | | ELECTRODE FINGER DUTY RATIO | 0.5 |
| | | INTERSECTING WIDTH (μm) | 7.68345 |
| CANCEL CIRCUIT 40A | IDT ELECTRODE 451 | ELECTRODE FINGER PITCH (μm) | 3.06023-3.48231 |
| | | ELECTRODE FINGER DUTY RATIO | 0.5 |
| | | INTERSECTING WIDTH (μm) | 7.00877 |
| | IDT ELECTRODE 452 | ELECTRODE FINGER PITCH (μm) | 3.46196-3.51933 |
| | | ELECTRODE FINGER DUTY RATIO | 0.5 |
| | | INTERSECTING WIDTH (μm) | 7.00877 |
| | IDT ELECTRODE 453 | ELECTRODE FINGER PITCH (μm) | 3.22262-3.54627 |
| | | ELECTRODE FINGER DUTY RATIO | 0.5 |
| | | INTERSECTING WIDTH (μm) | 7.00877 |

As indicated in Table 1, in the multiplexer 1A according to the Example 1, the electrode finger pitch of the IDT electrode 352 is different from the electrode finger pitch of the IDT electrode 353, as a non-limiting example of a method for making the resonant frequency defined by the IDT electrode 352 different from the resonant frequency defined by the IDT electrode 353.

As illustrated in FIG. 3, compared to the multiplexer according to the Comparative Example, the multiplexer 1A according to the Example 1 has improved isolation (insertion loss (attenuation)) in both of the transmission band (the first frequency band) and the reception band (the second frequency band). In the multiplexer 1A according to the Example 1, the transmission band (first frequency band) isolation is primarily improved by the cancel circuit 30A, whereas both of the reception band (second frequency band) and the transmission band (first frequency band) isolation are improved by the series circuit defined by the cancel circuits 30A and 40A.

With a conventional multiplexer in which no cancel circuits are disposed between the input/output terminal 110 and the input/output terminal 120, it is difficult to reduce or prevent unnecessary signals between the input/output terminal 110 and the input/output terminal 120.

Additionally, with a conventional multiplexer in which only one path including a cancel circuit is provided between the input/output terminal 110 and the input/output terminal 120, it is difficult to reduce or prevent multiple unnecessary signals, such as unnecessary signals in two or more discrete frequency bands or multiple unnecessary signals having different signal strengths.

However, with the multiplexer 1A according to the Example 1, multiple unnecessary signals flowing between the input/output terminal 110 and the input/output terminal 120 are able to be effectively reduced or prevented by two circuit configurations, namely (1) the cancel circuit 30A, and (2) a circuit in which the cancel circuit 30A and the cancel circuit 40A are connected in series. As such, not only is the reception band (second frequency band) isolation improved, but the transmission band (first frequency band) isolation is also improved, as indicated in FIG. 3, for example.

Furthermore, the above-described two circuit configurations, which generate signals to reduce or prevent multiple unnecessary signals, share the cancel circuit 30A, and thus, the multiplexer 1A is able to be provided with a small-sized cancel circuit that effectively reduces or prevents the unnecessary signals.

Figure 4:
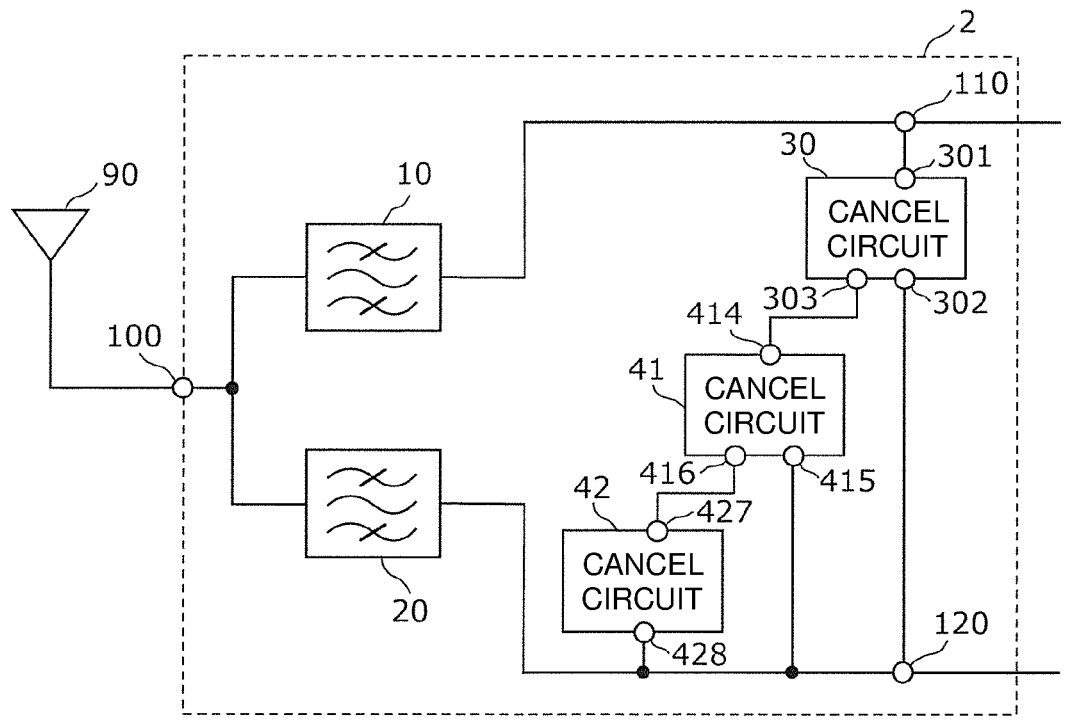
FIG. 4 is a circuit configuration diagram illustrating a multiplexer and peripheral circuitry thereof, according to a Variation 1 of a preferred embodiment of the present invention.

FIG. 4 is a circuit configuration diagram illustrating a multiplexer 2 and peripheral circuitry thereof, according to a Variation 1 of a preferred embodiment of the present invention. FIG. 4 illustrates the multiplexer 2 and the antenna element 90 according to the present variation.

The multiplexer 2 includes the filters 10 and 20, cancel circuits 30, 41, and 42, the common terminal 100, the input/output terminal 110 (the first input/output terminal), and the input/output terminal 120 (the second input/output terminal). The filter 10 and the filter 20 are connected in common to the common terminal 100. The multiplexer 2 according to the present variation differs from the multiplexer 1 according to the preferred embodiment in that the cancel circuits 41 and 42 are provided, instead of the cancel circuit 40. Hereinafter, the multiplexer 2 according to the present variation will be described, omitting descriptions of configurations that are the same as or similar to the multiplexer 1 according to the above-described preferred embodiment, and focusing instead on the differences.

The cancel circuit 41 is a second cancel circuit, and includes a terminal 414 (a fourth terminal), a terminal 415 (a fifth terminal), a terminal 416 (a sixth terminal), and a second elastic wave resonator. The terminal 414 and the terminal 415 are acoustically connected via the second elastic wave resonator. Additionally, the terminal 414 and the terminal 416 are acoustically connected via the second elastic wave resonator.

The cancel circuit 30 and the cancel circuit 41 are not acoustically connected. The terminal 301 is connected to the input/output terminal 110, and the terminal 302 is connected to the input/output terminal 120 without going through the cancel circuit 41. Additionally, the terminal 414 is connected to the terminal 303, and the terminal 415 is connected to the input/output terminal 120.

The cancel circuit 42 is a third cancel circuit, and includes a terminal 427 (a seventh terminal), a terminal 428 (an eighth terminal), and a third elastic wave resonator. The terminal 427 and the terminal 428 are acoustically connected via the third elastic wave resonator.

The cancel circuit 41 and the cancel circuit 42 are not acoustically connected. The terminal 427 is connected to the terminal 416, and the terminal 428 is connected to the input/output terminal 120.

Note that circuit elements, such as an elastic wave resonator, an inductor, a capacitor, or a switch, for example, may be disposed between the terminal 301 and the input/output terminal 110. Additionally, circuit elements, such as an elastic wave resonator, an inductor, a capacitor, or a switch, for example, may be disposed between the terminal 302 and the input/output terminal 120, between the terminal 415 and the input/output terminal 120, and between the terminal 428 and the input/output terminal 120.

According to the above-described configuration, multiple unnecessary signals flowing between the input/output terminal 110 and the input/output terminal 120 are able to be effectively reduced or prevented by three circuit configurations, namely (1) the cancel circuit 30, (2) a circuit in which the cancel circuit 30 and the cancel circuit 41 are connected in series, and (3) a circuit in which the cancel circuit 30, the cancel circuit 41, and the cancel circuit 42 are connected in series. Furthermore, the three circuit configurations, which generate signals to reduce or prevent multiple unnecessary signals, share the cancel circuit 30 and the cancel circuit 41, and thus, the multiplexer 2 is able to be provided with a small-sized cancel circuit that effectively reduces or prevents multiple unnecessary signals arising among the plurality of filter circuits.

Figure 5:
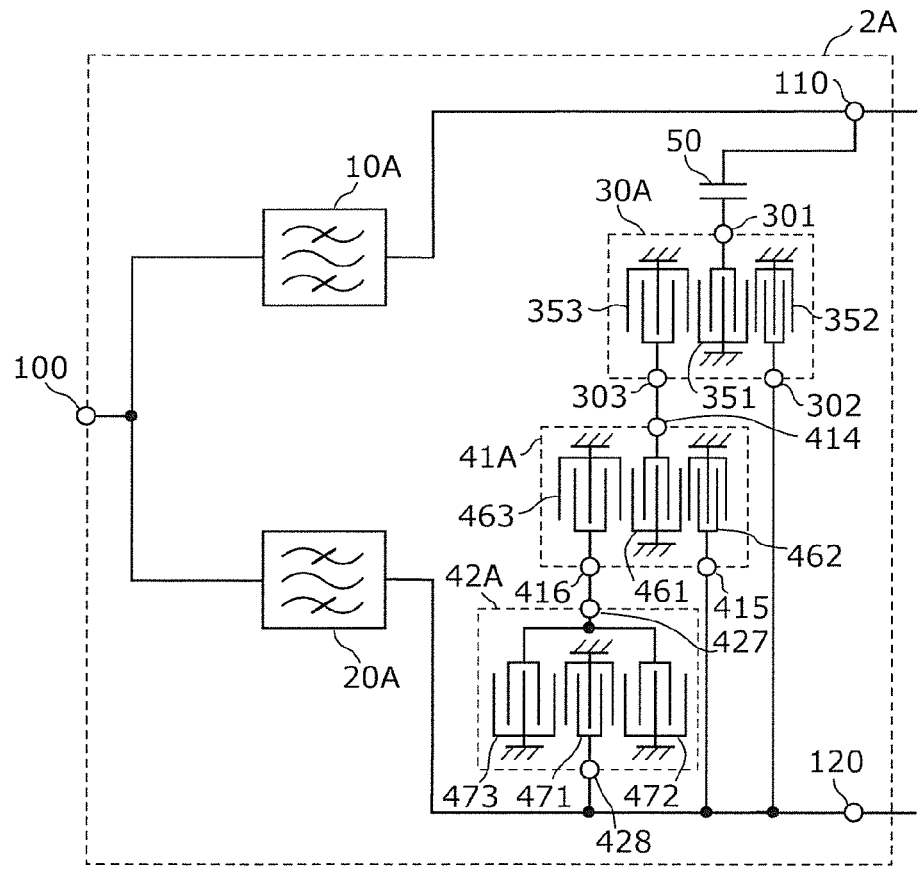
FIG. 5 is a circuit configuration diagram illustrating a multiplexer according to an Example 2 of a preferred embodiment of the present invention.

FIG. 5 is a circuit configuration diagram illustrating a multiplexer 2A according to an Example 2 of a preferred embodiment of the present invention. The multiplexer 2A illustrated in FIG. 5 is an example of a specific circuit configuration of the multiplexer 2 according to a Variation 1 of a preferred embodiment of the present invention. The multiplexer 2A includes the filters 10A and 20A, cancel circuits 30A, 41A, and 42A, the capacitance element 50, the common terminal 100, the input/output terminal 110 (the first input/output terminal), and the input/output terminal 120 (the second input/output terminal). The filter 10A and the filter 20A are connected in common to the common terminal 100. The multiplexer 2A according to the present example differs from the multiplexer 1A according to the Example 1 in that the cancel circuits 41A and 42A are provided, instead of the cancel circuit 40A. Hereinafter, the multiplexer 2A according to the present example will be described, omitting descriptions of configurations that are the same as or similar to the multiplexer 1A according to the Example 1, and focusing instead on the differences.

The cancel circuit 41A is a second cancel circuit, and includes the terminals 414, 415, and 416, and a second longitudinally-coupled resonator. The second longitudinally-coupled resonator is a second elastic wave resonator including a substrate having piezoelectric properties, and an IDT electrode 461 (a fourth IDT electrode), an IDT electrode 462 (a fifth IDT electrode), and an IDT electrode 463 provided on the stated substrate. Each of the IDT electrodes 461, 462, and 463 includes a pair of comb-shaped electrodes. Each of the comb-shaped electrodes includes a plurality of electrode fingers parallel or substantially parallel to each other and a busbar electrode connecting one end of each of the electrode fingers to each other, and the pair of comb-shaped electrodes are provided by interleaving the electrode fingers of the two comb-shaped electrodes. It is preferable that the substrate having piezoelectric properties of the second longitudinally-coupled resonator is the same as the substrate having piezoelectric properties of the first longitudinally-coupled resonator.

The IDT electrode 461 and the IDT electrode 462 are adjacent to each other with respect to the arrangement direction of the plurality of electrode fingers (a direction intersecting with the direction in which the electrode fingers extend), and the IDT electrode 461 and the IDT electrode 463 are adjacent to each other with respect to the arrangement direction. In other words, the IDT electrode 461 and the IDT electrode 462 are acoustically connected, and the IDT electrode 461 and the IDT electrode 463 are acoustically connected. Although not shown, a reflector may be provided on the outer side in the arrangement direction of the IDT electrodes 462 and 463. The IDT electrode 461 is connected to the terminal 414, the IDT electrode 462 is connected to the terminal 415, and the IDT electrode 463 is connected to the terminal 416.

Here, a resonant frequency defined by the substrate and the IDT electrode 462 may be different from a resonant frequency defined by the substrate and the IDT electrode 463.

As a result, the phase and amplitude of an output signal from the terminal 415 of the cancel circuit 41A is different from the phase and amplitude of an output signal from the terminal 416 of the cancel circuit 41A. Accordingly, multiple unnecessary signals flowing between the input/output terminal 110 and the input/output terminal 120 are able to be effectively reduced or prevented by a small-sized cancel circuit defined by the cancel circuits 30A and 41A.

As a non-limiting example of a method for making the resonant frequency defined by the IDT electrode 462 different from the resonant frequency defined by the IDT electrode 463, the electrode finger pitch of the IDT electrode 462 may preferably be different from the electrode finger pitch of the IDT electrode 463.

The second longitudinally-coupled resonator of the cancel circuit 41A is not limited to including the three IDT electrodes 461, 462, and 463. A configuration including four or more IDT electrodes, such as a configuration including five IDT electrodes or a configuration including seven IDT electrodes, may also be provided.

The cancel circuit 42A is a third cancel circuit, and includes the terminals 427 and 428, and a third longitudinally-coupled resonator. The third longitudinally-coupled resonator is a third elastic wave resonator including a substrate having piezoelectric properties, and an IDT electrode 471, an IDT electrode 472, and an IDT electrode 473 provided on the substrate. Each of the IDT electrodes 471, 472, and 473 includes a pair of comb-shaped electrodes. Each of the comb-shaped electrodes includes a plurality of electrode fingers parallel or substantially parallel to each other and a busbar electrode connecting one end of each of the electrode fingers to each other, and the pair of comb-shaped electrodes is provided by interleaving the electrode fingers of the two comb-shaped electrodes. It is preferable that the substrate having piezoelectric properties of the third longitudinally-coupled resonator is the same as the substrate having piezoelectric properties of the first longitudinally-coupled resonator and the second longitudinally-coupled resonator.

The IDT electrode 471 and the IDT electrode 472 are adjacent to each other with respect to the arrangement direction of the plurality of electrode fingers (a direction intersecting with the direction in which the electrode fingers extend), and the IDT electrode 471 and the IDT electrode 473 are adjacent to each other with respect to the arrangement direction. In other words, the IDT electrode 471 and the IDT electrode 472 are acoustically connected, and the IDT electrode 471 and the IDT electrode 473 are acoustically connected. Although not shown, a reflector may be provided on the outer side in the arrangement direction of the IDT electrodes 472 and 473. The IDT electrodes 472 and 473 are connected to the terminal 427, and the IDT electrode 471 is connected to the terminal 428.

The third longitudinally-coupled resonator of the cancel circuit 42A is not limited to including the three IDT electrodes 471, 472, and 473. Any configuration including two or more IDT electrodes, such as a configuration including two IDT electrodes or a configuration including four IDT electrodes, may also be provided.

According to the above-described configuration, (1) the phase and amplitude of an output signal from the terminal 302 of the cancel circuit 30A, (2) the phase and amplitude of an output signal from the series circuit of the cancel circuits 30A and 41A (the terminal 415), and (3) the phase and amplitude of an output signal from the series circuit of the cancel circuits 30A, 41A, and 42A (the terminal 428) are different from each other. As such, multiple unnecessary signals flowing between the input/output terminal 110 and the input/output terminal 120 are able to be effectively reduced or prevented by three circuit configurations, namely (1) the cancel circuit 30A, (2) a circuit in which the cancel circuit 30A and the cancel circuit 41A are connected in series, and (3) a circuit in which the cancel circuit 30A, the cancel circuit 41A, and the cancel circuit 42A are connected in series. For example, not only is the reception band (second frequency band) isolation improved, but also the transmission band (first frequency band) isolation, the transmission harmonic band, and other characteristics are able to be improved.

Furthermore, the three circuit configurations, which generate signals to reduce or prevent multiple unnecessary signals, share the cancel circuit 30A, and thus, the multiplexer 2A is able to be provided with a small-sized cancel circuit that effectively reduces or prevents the unnecessary signals.

Figure 6:
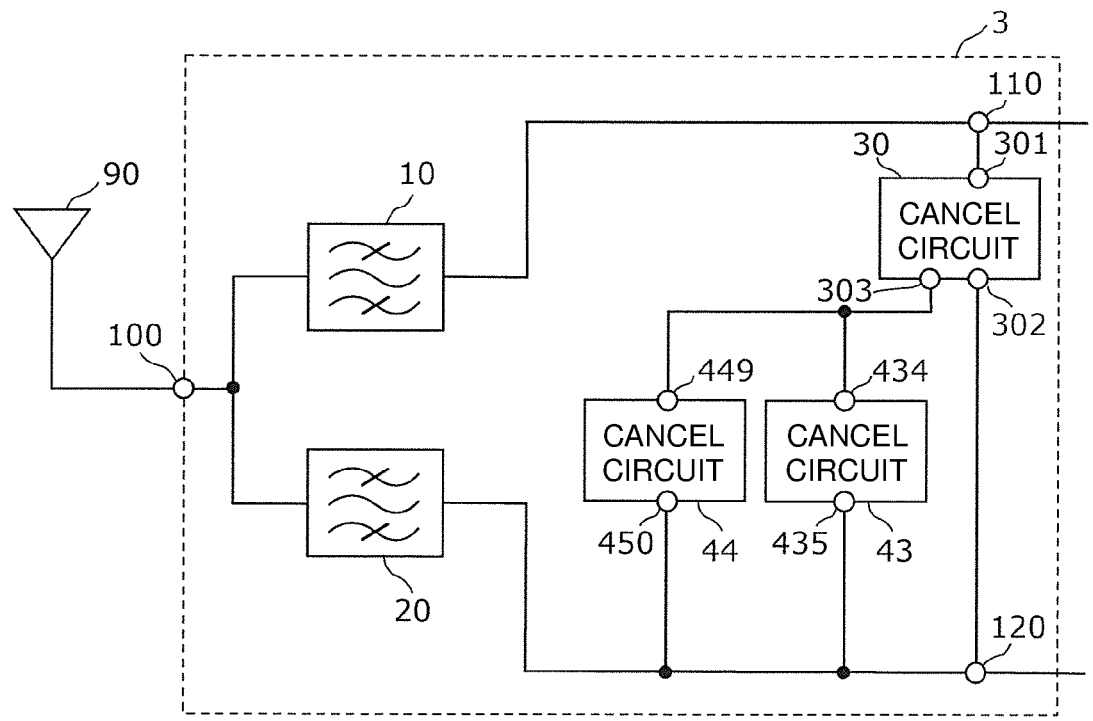
FIG. 6 is a circuit configuration diagram illustrating a multiplexer and peripheral circuitry thereof, according to a Variation 2 of a preferred embodiment of the present invention.

FIG. 6 is a circuit configuration diagram illustrating a multiplexer 3 and peripheral circuitry thereof, according to a Variation 2 of a preferred embodiment of the present invention. FIG. 6 illustrates the multiplexer 3 and the antenna element 90 according to the present variation.

The multiplexer 3 includes the filters 10 and 20, cancel circuits 30, 43, and 44, the common terminal 100, the input/output terminal 110 (the first input/output terminal), and the input/output terminal 120 (the second input/output terminal). The filter 10 and the filter 20 are connected in common to the common terminal 100. The multiplexer 3 according to the present variation differs from the multiplexer 1 according to the above-described preferred embodiment in that the cancel circuits 43 and 44 are provided, instead of the cancel circuit 40. Hereinafter, the multiplexer 3 according to the present variation will be described, omitting descriptions of configurations that are the same as or similar to in the multiplexer 1 according to the above-described preferred embodiment, and focusing instead on the differences.

The cancel circuit 43 is a second cancel circuit, and includes a terminal 434 (a fourth terminal), a terminal 435 (a fifth terminal), and a second elastic wave resonator. The terminal 434 and the terminal 435 are acoustically connected via the second elastic wave resonator.

The cancel circuit 30 and the cancel circuit 43 are not acoustically connected. The terminal 301 is connected to the input/output terminal 110, and the terminal 302 is connected to the input/output terminal 120 without going through the cancel circuit 43. Additionally, the terminal 434 is connected to the terminal 303, and the terminal 435 is connected to the input/output terminal 120.

The cancel circuit 44 is a fourth cancel circuit, and includes a terminal 449 (a ninth terminal), and a terminal 450 (a tenth terminal), and a fourth elastic wave resonator. The terminal 449 and the terminal 450 are acoustically connected via the fourth elastic wave resonator.

The cancel circuit 30, the cancel circuit 43, and the cancel circuit 44 are not acoustically connected. The terminal 449 is connected to the terminal 303, and the terminal 450 is connected to the input/output terminal 120.

Note that circuit elements, such as an elastic wave resonator, an inductor, a capacitor, or a switch, for example, may be disposed between the terminal 301 and the input/output terminal 110. Additionally, circuit elements such as an elastic wave resonator, an inductor, a capacitor, or a switch, for example, may be disposed between the terminal 302 and the input/output terminal 120, between the terminal 435 and the input/output terminal 120, and between the terminal 450 and the input/output terminal 120.

According to the above-described configuration, multiple unnecessary signals flowing between the input/output terminal 110 and the input/output terminal 120 are able to be effectively reduced or prevented by three circuit configurations, namely (1) the cancel circuit 30, (2) a circuit in which the cancel circuit 30 and the cancel circuit 43 are connected in series, and (3) a circuit in which the cancel circuit 30 and the cancel circuit 44 are connected in series. Furthermore, the above-described three circuit configurations, which generate signals to reduce or prevent multiple unnecessary signals, share the cancel circuit 30, and thus, the multiplexer 3 is able to be provided with a small-sized cancel circuit that effectively reduces or prevents multiple unnecessary signals arising among the plurality of filter circuits.

Multiplexers according to examples of the present invention have been described with reference to preferred embodiments, examples, and variations. However, the present invention is not intended to be limited to the above-described preferred embodiments, examples, and variations. Other preferred embodiments provided by combining the elements of the preferred embodiments, examples, and variations as desired, variations arrived at by one skilled in the art making various modifications to the above-described preferred embodiments that do not depart from the essential spirit of the present invention, various types of devices that include the multiplexer according to preferred embodiments of the present invention, and the like are also included in the present invention.

In the multiplexers according to the above-described preferred embodiments, the filter 10 is a transmission filter and the filter 20 is a reception filter. However, the filter 10 may be a reception filter and the filter 20 may be a transmission filter. The configuration may be such that both of the filters 10 and 20 are transmission filters, or both of the filters 10 and 20 are reception filters. Furthermore, the number of filters connected to the common terminal 100 is not limited to two, and may be three or more.

Additionally, although the filters 10 and 20 according to the above-described preferred embodiments are typically surface acoustic wave filters including IDT electrodes, the filters of the multiplexers according to preferred embodiments of the present invention may be elastic wave filters using boundary acoustic waves or bulk acoustic waves (BAW), for example. Even in this case, the same or substantially the same advantageous effects as those of the multiplexer according to the above-described preferred embodiments are able to be achieved.

Also, for example, inductors, capacitors, or other suitable components may be connected between elements in the multiplexer. The inductors may include wire inductors defined by wires connecting the elements.

Preferred embodiments of the present invention may be widely used in communication devices, such as cellular phones, for example, as a high-isolation multiplexer applicable in multi-band frequency standards.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A multiplexer comprising:
   a common terminal, a first input/output terminal, and a second input/output terminal into and from which a high-frequency signal is input/output;
   a first filter circuit having a first frequency band as a pass band and being connected between the common terminal and the first input/output terminal;
   a second filter circuit having a second frequency band, which is different from the first frequency band, as a pass band, and being connected between the common terminal and the second input/output terminal;
   a first cancel circuit including a first elastic wave resonator, a first terminal, a second terminal acoustically connected to the first terminal via the first elastic wave resonator, and a third terminal acoustically connected to the first terminal via the first elastic wave resonator; and
   a second cancel circuit including a second elastic wave resonator, a fourth terminal, and a fifth terminal acoustically connected to the fourth terminal via the second elastic wave resonator; wherein
   the first terminal is connected to the first input/output terminal, the second terminal is connected to the second input/output terminal without going through the second cancel circuit, the fourth terminal is connected to the third terminal without being acoustically connected to the first cancel circuit and the second cancel circuit, and the fifth terminal is connected to the second input/output terminal; and
   the first cancel circuit and the second cancel circuit generate signals that cancel out an unnecessary signal in a prescribed frequency band propagating between the first input/output terminal and the second input/output terminal.

2. The multiplexer according to claim 1, wherein
   the first elastic wave resonator is a longitudinally-coupled resonator including a substrate having piezoelectric properties and a plurality of IDT (InterDigitated Transducer) electrodes provided on the substrate;
   of the plurality of IDT electrodes, a first IDT electrode and a second IDT electrode are acoustically connected, the first IDT electrode and a third IDT electrode are acoustically connected, the first IDT electrode is connected to the first terminal, the second IDT electrode is connected to the second terminal, and the third IDT electrode is connected to the third terminal; and a resonant frequency defined by the second IDT electrode is different from a resonant frequency defined by the third IDT electrode.

3. The multiplexer according to claim 2, wherein an electrode finger pitch of the second IDT electrode is different from an electrode finger pitch of the third IDT electrode.

4. The multiplexer according to claim 2, wherein an electrode finger duty ratio of the second IDT electrode is different from an electrode finger duty ratio of the third IDT electrode.

5. The multiplexer according to claim 2, wherein the second elastic wave resonator is a longitudinally-coupled resonator including the substrate and a plurality of IDT electrodes provided on the substrate; and of the plurality of IDT electrodes, a fourth IDT electrode and a fifth IDT electrode are acoustically connected, the fourth IDT electrode is connected to the fourth terminal, and the fifth IDT electrode is connected to the fifth terminal.

6. The multiplexer according to claim 2, wherein the first filter circuit is a transmission-side filter that propagates a high-frequency signal from the first terminal to the common terminal;

the second filter circuit is a reception-side filter that propagates a high-frequency signal from the common terminal to the second terminal;

the prescribed frequency band is included in at least one of the first frequency band and the second frequency band, and the signals generated by the first cancel circuit and the second cancel circuit have different phases from the unnecessary signal; and the frequency at which the first elastic wave resonator has a minimum insertion loss is located in at least one of the first frequency band and the second frequency band.

7. The multiplexer according to claim 1, wherein each of the first filter circuit and the second filter circuit is a ladder elastic wave filter circuit including a plurality of elastic wave resonators.

8. The multiplexer according to claim 1, wherein the second cancel circuit further includes a sixth terminal acoustically connected to the fourth terminal via the second elastic wave resonator;

the multiplexer further includes a third cancel circuit including a third elastic wave resonator, a seventh terminal, and an eighth terminal acoustically connected to the seventh terminal via the third elastic wave resonator; and the sixth terminal is connected to the seventh terminal without being acoustically connected to the second cancel circuit and the third cancel circuit, and the eighth terminal is connected to the second input/output terminal.

9. The multiplexer according to claim 1, further comprising:

a fourth cancel circuit including a fourth elastic wave resonator, a ninth terminal, and a tenth terminal acoustically connected to the ninth terminal via the fourth elastic wave resonator; wherein the ninth terminal is connected to the third terminal without being acoustically connected to the first cancel circuit and the fourth cancel circuit, and the tenth terminal is connected to the second input/output terminal.

10. The multiplexer according to claim 1, wherein the pass band of the second filter circuit is higher than the pass band of the first filter circuit.

* * * * *